(12) United States Patent
Loubet et al.

(10) Patent No.: US 9,620,507 B2
(45) Date of Patent: Apr. 11, 2017

(54) SILICON-ON-NOTHING TRANSISTOR SEMICONDUCTOR STRUCTURE WITH CHANNEL EPITAXIAL SILICON-GERMANIUM REGION

(71) Applicants: STMicroelectronics, Inc., Coppell, TX (US); International Business Machines Corporation, Armonk, NY (US)

(72) Inventors: Nicolas Loubet, Guilderland, NY (US); Qing Liu, Guilderland, NY (US); Prasanna Khare, Schenectady, NY (US); Stephane Allegret-Maret, Grenoble (FR); Bruce Doris, Slingerlands, NY (US); Kangguo Cheng, Schenectady, NY (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 319 days.

(21) Appl. No.: 13/907,460

(22) Filed: May 31, 2013

(65) Prior Publication Data

US 2014/0353718 A1 Dec. 4, 2014

(51) Int. Cl.

| H01L 27/11 | (2006.01) |
|---|---|
| H01L 27/092 | (2006.01) |
| H01L 21/8238 | (2006.01) |
| H01L 21/84 | (2006.01) |
| H01L 29/66 | (2006.01) |
| H01L 29/786 | (2006.01) |

(52) U.S. Cl.
CPC .... *H01L 27/092* (2013.01); *H01L 21/823807* (2013.01); *H01L 21/823814* (2013.01); *H01L 21/84* (2013.01); *H01L 27/1104* (2013.01); *H01L 27/1116* (2013.01); *H01L 29/66772* (2013.01); *H01L 29/78654* (2013.01)

(58) Field of Classification Search
USPC .......................... 257/192, 288; 438/285, 300
See application file for complete search history.

(56) References Cited

U.S. PATENT DOCUMENTS

| 2008/0102573 A1* | 5/2008 | Liang et al. ................... 438/231 |
|---|---|---|
| 2011/0180872 A1* | 7/2011 | Yin et al. ....................... 257/347 |
| 2013/0175604 A1* | 7/2013 | Polishchuk ........... H01L 29/792 257/325 |

* cited by examiner

*Primary Examiner* — Hrayr A Sayadian
(74) *Attorney, Agent, or Firm* — Seed Intellectual Property Law Group LLP

(57) ABSTRACT

An improved transistor with channel epitaxial silicon and methods for fabrication thereof. In one aspect, a method for fabricating a transistor includes: forming a gate stack structure on an epitaxial silicon region, a width dimension of the epitaxial silicon region approximating a width dimension of the gate stack structure; encapsulating the epitaxial silicon region under the gate stack structure with sacrificial spacers formed on both sides of the gate stack structure and the epitaxial silicon region; forming a channel of the transistor having a width dimension that approximates that of the epitaxial silicon region and the gate stack structure, the epitaxial silicon region and the gate stack structure formed on the channel of the transistor; removing the sacrificial spacers; and growing a raised epitaxial source and drain from the silicon substrate, with portions of the raised epitaxial source and drain in contact with the epitaxial silicon region.

22 Claims, 13 Drawing Sheets

2000

2010
FORM A GATE STACK STRUCTURE ON AN EXPITAXIAL SILICON REGION DISPOSED ON A SILICON SUBSTRATE, A WIDTH DIMENSION OF THE EXPITAXIAL SILICON REGION APPROXIMATING A WIDTH DIMENSION OF THE GATE STACK STRUCTURE

2020
ENCAPSULATE THE EXPITAXIAL SILICON REGION UNDER THE GATE STACK STRUCTURE WITH SCARIFICIAL SPACERS FORMED ON BOTH SIDES OF THE GATE STACK STRUCTURE AND THE EXPITAXIAL SILICON REGION

2030
FORM A CHANNEL OF THE TRANSISTOR HAVING A WIDTH DIMENSION THAT APPROXIMATES THAT OF THE EXPITAXIAL SILICON REGION AND THE GATE STACK STRUCTURE, THE EXPITAXIAL SILICON REGION AND THE GATE STACK STRUCTURE FORMED ON THE CHANNEL OF THE TRANSISTOR

2040
GROW A RAISED EXPITAXIAL SOURCE AND DRAIN FROM THE SILICON SUBSTRATE WITH PORTIONS THAT ARE IN CONTACT WITH THE EXPITAXIAL SILICON REGION UNDER THE GATE STACK STRUCTURE

*FIG. 20*

SILICON-ON-NOTHING TRANSISTOR SEMICONDUCTOR STRUCTURE WITH CHANNEL EPITAXIAL SILICON-GERMANIUM REGION

CROSS REFERENCE TO RELATED APPLICATIONS

This application is related to the following co-pending U.S. patent application Ser. No. 13/907,411, filed on even date herewith, which is incorporated herein in its entirety.

TECHNICAL FIELD

The present disclosure relates to the fabrication of integrated circuit transistors, and in particular, to the fabrication of silicon germanium channels on silicon-on-nothing (SON) devices.

BACKGROUND

In the semiconductor industry there is a continuing trend toward manufacturing integrated circuits (ICs) with higher densities. Smaller feature sizes, smaller separations between features and more precise feature shapes are desired in integrated circuits (ICs) fabricated on small rectangular portions of the wafer, commonly known as dies. This may include the width and spacing of interconnecting lines, spacing and diameter of contact holes, as well as the surface geometry of various other features (e.g., corners and edges). The scaling-down of integrated circuit dimensions can facilitate faster circuit performance and/or switching speeds, and can lead to higher cost efficiency in IC fabrication by providing more circuits on a die and/or more die per semiconductor wafer.

In the case of a conventional MOS transistor in "bulk" technology, active zones of the device are directly implanted in a mass ("bulk") of thick silicon forming the silicon substrate. The presence of a thick substrate that is electrically continuous with the active superficial layers, however, induces parasitic phenomena therein, and makes them sensitive to electrical disturbances (for example, leakage currents toward the substrate).

A desirable feature of transistors fabricated using silicon-on-nothing (SON) technology, by comparison with the conventional "bulk" transistors, is the presence of a thin embedded dielectric layer, which insulates the conductive channel of the transistor from the substrate and provides for better control of parasitic effects. SON technology also makes it possible to produce transistors with dynamic properties that are superior to those of the conventional CMOS technology and that are characterized by lower power consumption.

There is a need for circuits that are capable of simultaneously integrating components whose functions involves electrical properties specific to "bulk" devices, and components performing faster functions and thus involving electrical properties specific to SON. Therefore, there is a need to integrate these two types of devices on a single substrate.

BRIEF DESCRIPTION OF THE DRAWINGS

Example embodiments of the present disclosure will be described below with reference to the included drawings such that like reference numerals refer to like elements and in which:

FIG. 20 is a process flow diagram illustrating formation of a transistor device described herein, in accordance with exemplary embodiments of the present disclosure.

DETAILED DESCRIPTION

Figure 1:
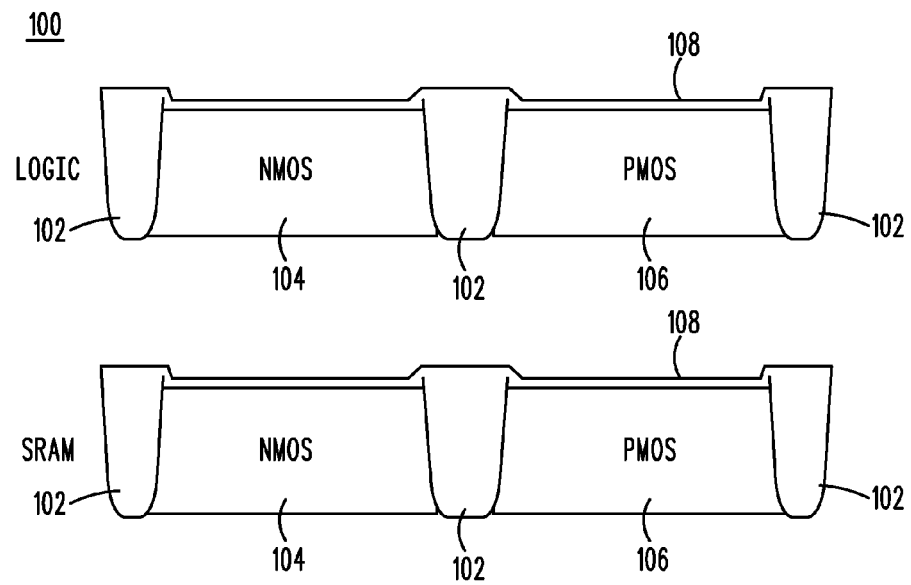
FIG. 1 illustrates formation of a trench structure, in accordance with embodiments of the present disclosure.

For simplicity and clarity of illustration, reference numerals may be repeated among the figures to indicate corresponding or analogous elements. The sizes and relative positions of elements in the drawings are not necessarily drawn to scale. Numerous details are set forth to provide an understanding of the illustrative embodiments described herein. The embodiments may be practiced without these details. In other instances, well-known methods, procedures, and components have not been described in detail to avoid obscuring the disclosed embodiments. The description is not to be considered as limited to the scope of the exemplary embodiments shown and described herein.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Reference throughout this document to "one embodiment", "certain embodiments", "an embodiment", "an example", "an implementation", "an example" or similar terms means that a particular feature, structure, or characteristic described in connection with the embodiment, example or implementation is included in at least one embodiment, example or implementation of the present invention. Thus, the appearances of such phrases or in various places throughout this specification are not necessarily all referring to the same embodiment, example or implementation. Furthermore, the particular features, structures, or characteristics may be combined in any suitable manner in one or more embodiments, examples or implementations without limitation.

Unless the context requires otherwise, throughout the specification and claims that follow, the word "comprise" and variations thereof, such as "comprises" and "comprising" are to be construed in an open, inclusive sense, that is, as "including, but not limited to."

In accordance with certain aspects of the present disclosure, a transistor has a silicon substrate; an epitaxial silicon region coupled to an upper surface of the silicon substrate; a raised epitaxial source and drain in contact with a surface of the silicon substrate and having portions of the raised epitaxial source and drain in contact with the epitaxial silicon region; a gate stack structure in contact with the epitaxial silicon region and coupled to the raised epitaxial source and drain by the epitaxial silicon region.

Therefore, in accordance with embodiments described herein, a method to form a transistor on a silicon substrate, the method comprising: forming a gate stack structure on an epitaxial silicon region disposed on a silicon substrate, a width dimension of the epitaxial silicon region approximating a width dimension of the gate stack structure; encapsulating the epitaxial silicon region under the gate stack structure with sacrificial spacers formed on both sides of the gate stack structure and the epitaxial silicon region; forming a channel of the transistor having a width dimension that approximates that of the epitaxial silicon region and the gate stack structure, the epitaxial silicon region and the gate stack structure formed on the channel of the transistor; removing the sacrificial spacers; and growing a raised epitaxial source and drain from the silicon substrate, with portions of the raised epitaxial source and drain in contact with the epitaxial silicon region. In a PMOS device, the epitaxial silicon region under the gate stack enables voltage threshold Vth tuning of the PMOS device.

The trench structure 100 of FIG. 1 includes an N-doped substrate 106, a P-doped substrate 104, trenches 102 (three are shown), a hard mask oxide layer 108. This trench structure is formed in both logic structures and static random access memory (SRAM) structures of the integrated circuit, as shown.

Doped wells are formed in the silicon substrate to facilitate formation of NMOS and PMOS devices. PMOS devices are typically formed in an N-well that is doped with a material having an excess of electrons (e.g., Group V elements such as phosphorous or arsenic). NMOS devices are typically formed in a P-well that is doped with a material lacking valence electrons (e.g., a Group III element, typically boron).

The oxide hard mask 108 is deposited over the trenches 102 and substrate portions 104, 106 by a standard technique, for example, exposing the silicon to an oxygen-rich environment at high temperature for thermal oxidation of the silicon. The oxide layer 108 is a thin insulating layer used to passivate the silicon surface. Removal of a native oxide layer on the silicon surface can precede the growth of the pad oxide layer 108.

The oxide hard mask 108 may be a silicon dioxide (SiO2) mask or a mask of other isolation material. While the hard mask is described as SiO2, it may be formed of other materials. As is known, a hard mask technique is desirable when etching deep structures that require a longer etch time, because the hard mask can withstand the etch process more reliably than can a photoresist.

Figure 2:
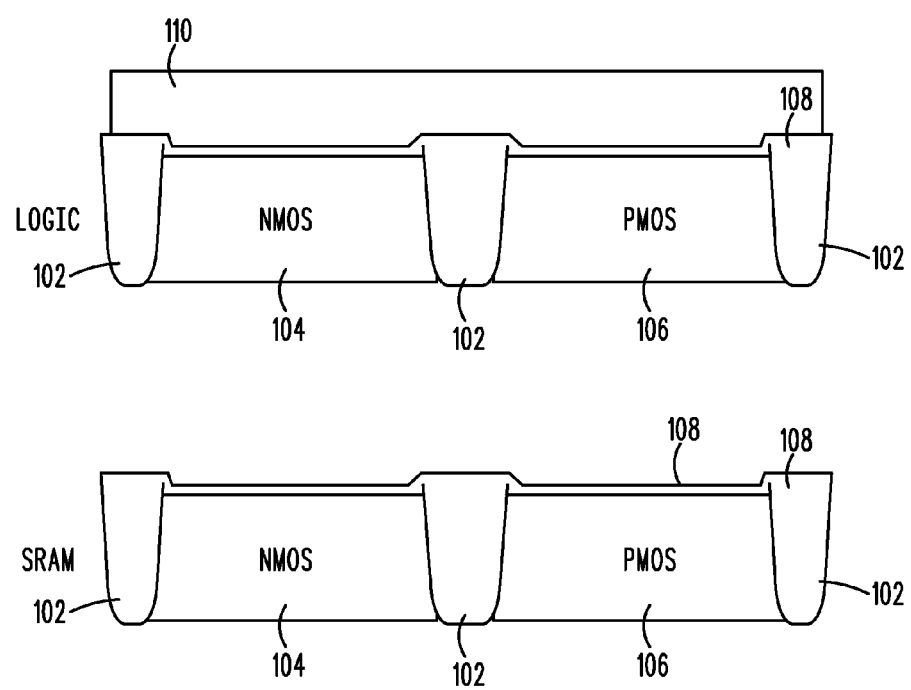
FIG. 2 illustrates a photoresist mask used in lithography to protect logic structures, in accordance with embodiments of the present disclosure.
Figure 3:
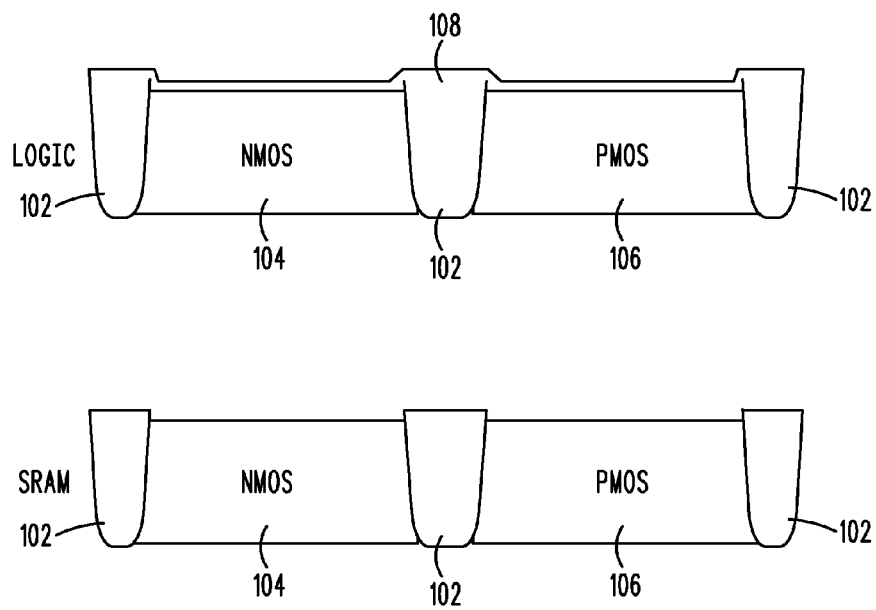
FIG. 3 illustrates hard mask removal on SRAM devices, in accordance with embodiments of the present disclosure.

Referring now to FIG. 2, a photoresist mask 110 is placed over the logic structures to protect the logic during the subsequent hard mask removal, illustrated in FIG. 3. Conventional optical lithography entails spinning on a photoresist, exposing portions of the photoresist to ultraviolet light through a patterned mask, and developing away the unexposed portions of the photoresist, thereby transferring the mask pattern to the photoresist. The photoresist mask can then be used to etch the mask pattern into one or more underlying layers. Typically, a photoresist mask can be used if the subsequent etch is relatively shallow, because photoresist is likely to be consumed during the etch process. In this manner, the oxide layer is removed from the doped substrate portions 104, 106 of the SRAM, expositing the silicon substrate. The SiO2 oxide pad 108 is left intact over the logic structures.

Figure 4:
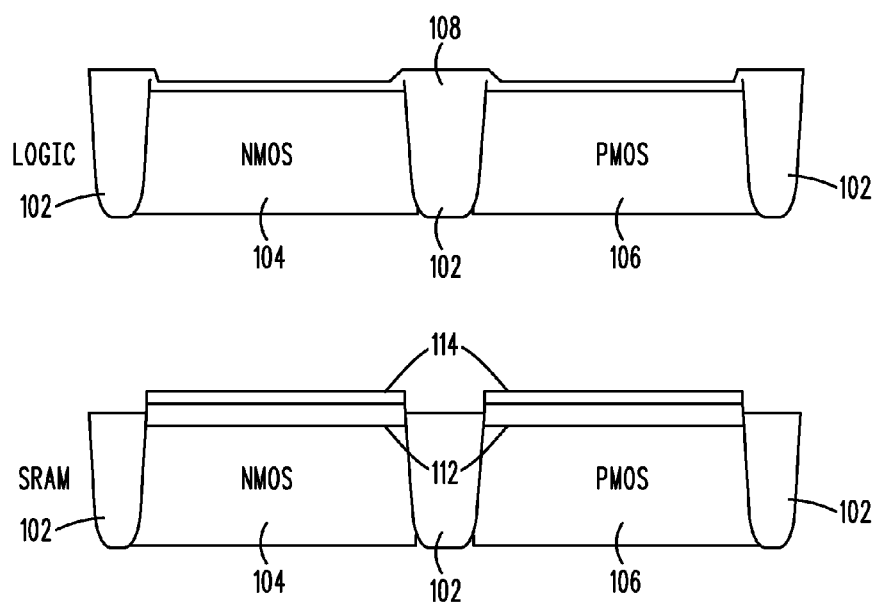
FIG. 4 illustrates selective silicon and silicon germanium on SRAM devices, in accordance with embodiments of the present disclosure.

Next, as shown in FIG. 4, a silicon germanium (SiGe) epitaxial layer 112 is selectively formed on the N-doped substrate 106 and a P-doped substrate 104 portions, followed by a silicon (Si) epitaxial layer selectively formed on the SiGe epitaxial layer. Silicon germanium (SiGe) epitaxy is performed on the doped substrate regions 104, 106 to form a SiGe epitaxial layer 110 from the substrate regions. As used herein, the term epitaxy refers to a controlled process of crystal growth in which a new, epitaxial, layer of a crystal is grown from the surface of a bulk crystal, while maintaining the same crystal structure of the underlying bulk crystal. In this example, the SiGe epitaxial layer 112 is formed to a thickness of between approximately 10 nm to approximately 50 nm and the Si epitaxial layer 114 is grown to a thickness of between approximately 2 nm to approximately 50 nm. The Si epitaxial layer 114, then, may be a thinner layer than the SiGe epitaxial layer 112. The epitaxial silicon compound used for the layer 112, for example, may be silicon germanium (SiGe) in which the germanium content is within the range of about 35% to about 65%.

There is no such epitaxial growth over the logic structures, which are still protected by the SiO2 hard mask.

The Si and SiGe layers described herein are examples of epitaxial silicon compounds, a term that is not to be construed narrowly to limit an epitaxially grown structure to Si, SiGe, or SiC, for example. Rather, the term "epitaxial silicon compounds" is broadly construed to cover any compounds and materials that can be grown epitaxially from a silicon substrate.

Figure 5:
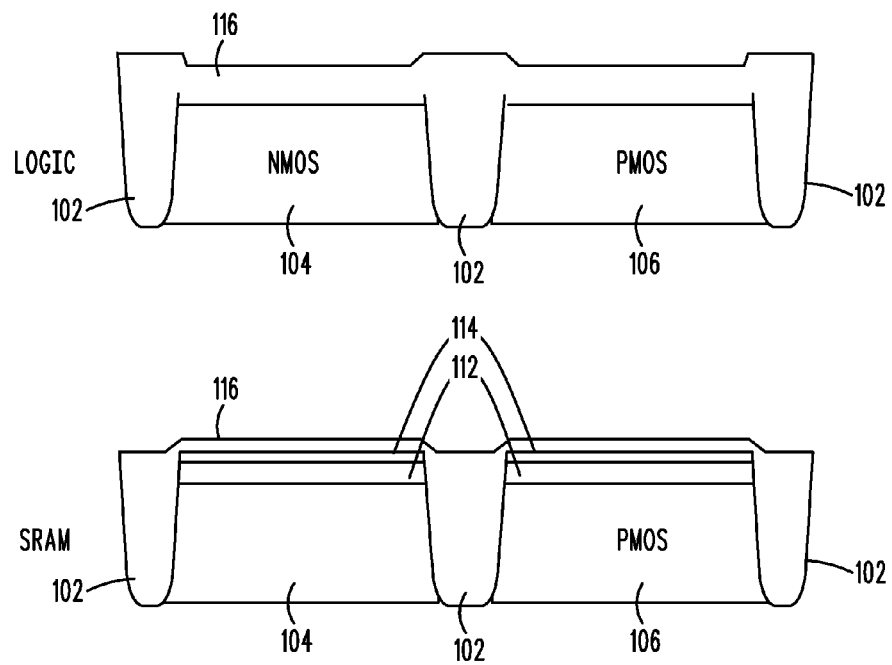
FIG. 5 illustrates oxide deposition, in accordance with embodiments of the present disclosure.

The selective epitaxial formation of FIG. 4 is followed by another oxide layer 116, such as SiO2, deposited over both logic and SRAM structures in FIG. 5. This results in double layers of oxide 108, 116 formed over the NMOS and PMOS logic devices. In the SRAM devices, the new oxide layer 116 overlays the selective epitaxial layers 112, 114, as shown.

Figure 6:
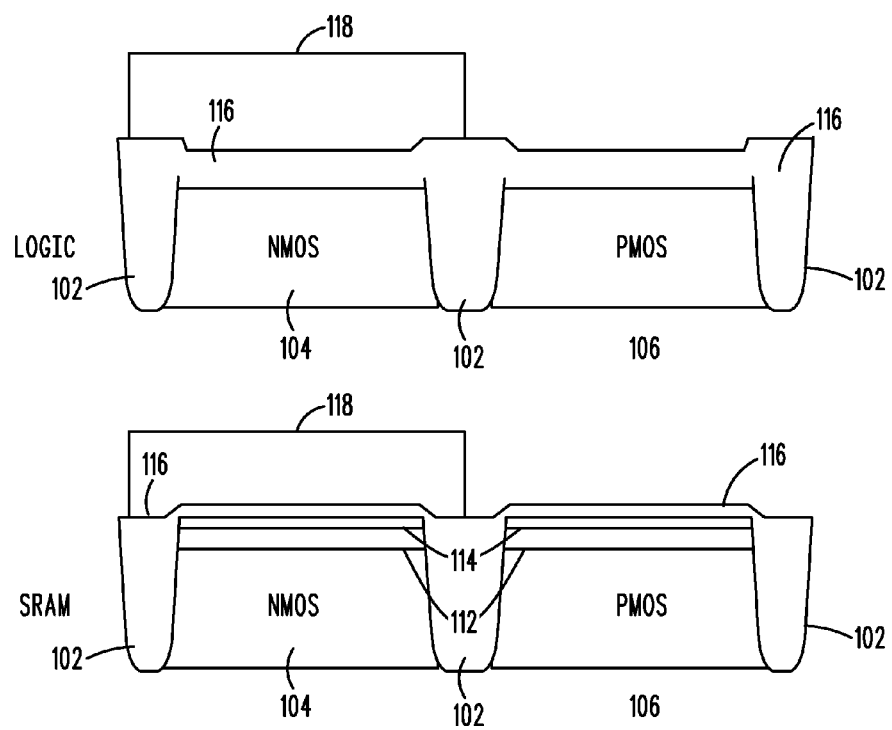
FIG. 6 illustrates a photoresist used in lithography to protect NMOS logic and NMOS SRAM structures, in accordance with embodiments of the present disclosure.
Figure 7:
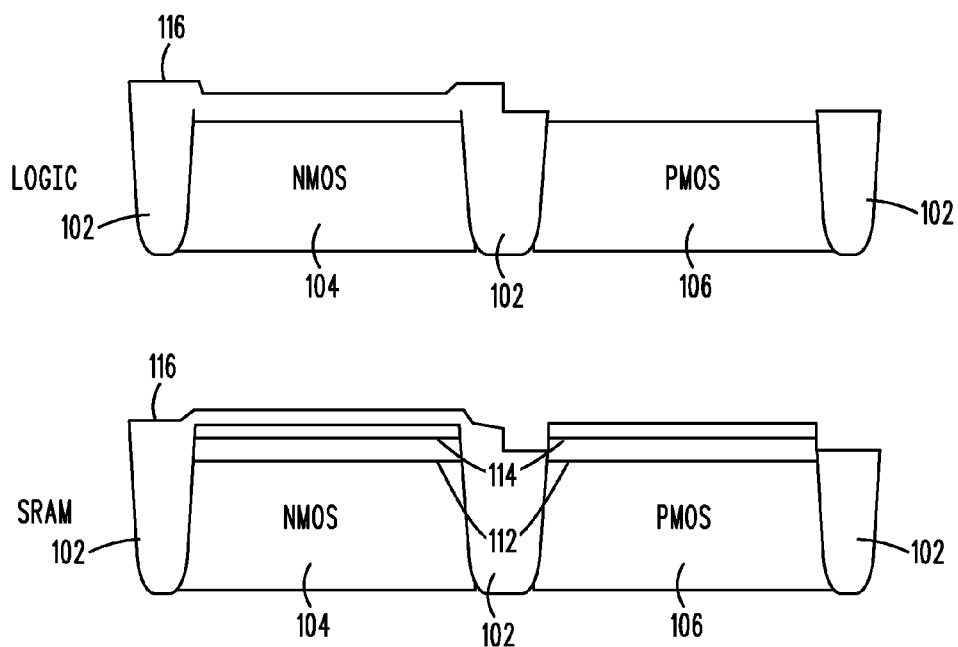
FIG. 7 illustrates hard mask removal on PMOS logic and PMOS SRAM structures, in accordance with embodiments of the present disclosure.

In FIG. 6, standard lithography is employed to deposit photoresist 118 over the NMOS devices to protect the NMOS devices of both the SRAM and logic regions from a subsequent etching process to selectively remove the oxide hard mask as illustrated in FIG. 7. As a conventional optical lithography and etch processes is well-known to those skilled in the art of semiconductor processing, it is not explicitly shown in the figures, but will be described briefly. Conventional optical lithography entails spinning on a photoresist, exposing portions of the photoresist to ultraviolet light through a patterned mask, and developing away the unexposed portions of the photoresist, thereby transferring the mask pattern to the photoresist. The photoresist mask can then be used to etch the mask pattern into one or more underlying layers. Typically, a photoresist mask can be used if the subsequent etch is relatively shallow, because photoresist is likely to be consumed during the etch process.

In this case, a hydrofluoric (HF) etch is used to selectively remove the oxide hard mask over the PMOS devices of the logic and SRAM regions. Other techniques may optionally be employed, such as, Reactive Ion Beam (RIE).

Figure 8:
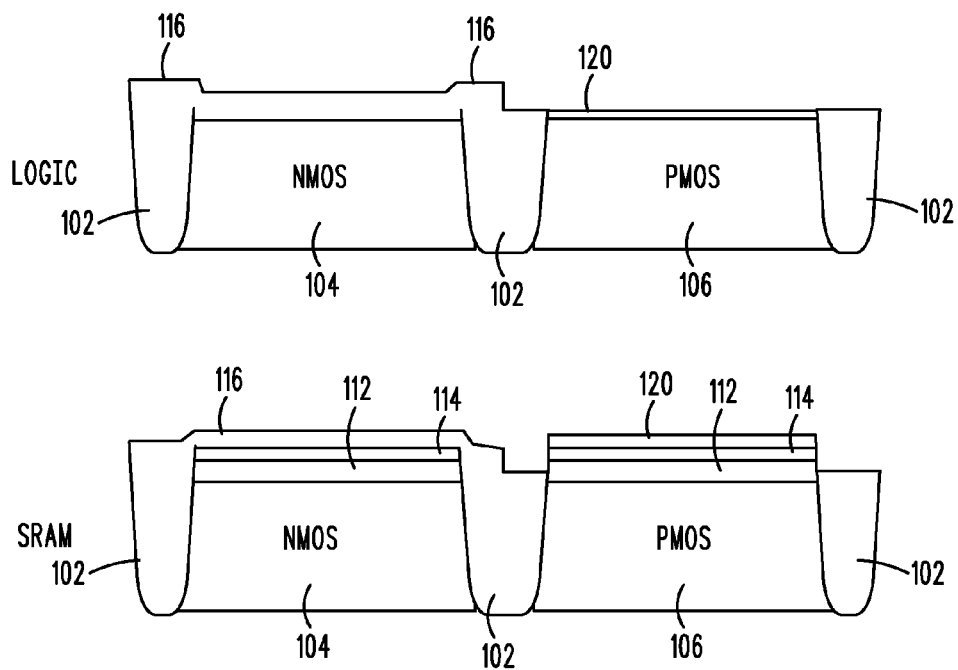
FIG. 8 illustrates selective epitaxial growth of silicon germanium on PMOS logic and PMOS SRAM structures, in accordance with embodiments of the present disclosure.
Figure 9:
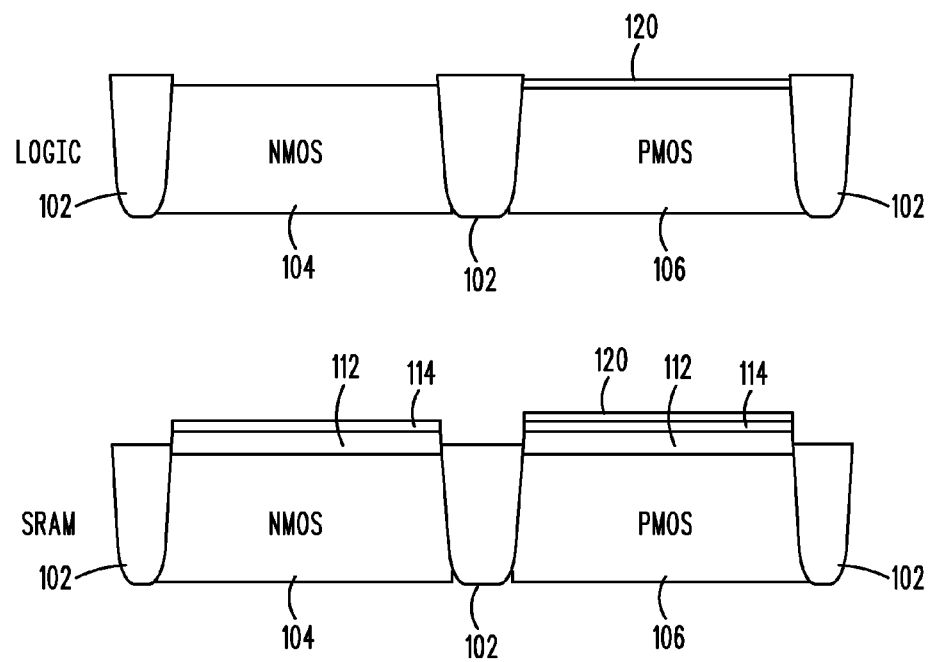
FIG. 9 illustrates hard mask removal, in accordance with embodiments of the present disclosure.

The etching of FIG. 7 is following by selective epitaxial growth (SEG) on the PMOS devices in FIG. 8. SiGe is selectively grown on the PMOS devices for both logic and SRAM as SiGe layer 120, as shown. Growth of SiGe may result in a layer of SiGe 120 of between approximately 2 nm to 50 nm. SiGe is used for hole mobility improvement and to tune the threshold voltage Vth of the transistor. The use of SiGe increases control of the mobility of charge carriers in the semiconducting channel. Introducing compressive strain into the transistor materials tends to increase charge mobility, resulting in a faster switching response to changes in voltage applied to the gate. Strain can be introduced, for example, by replacing bulk silicon in the source and drain regions, or in the channel itself, with epitaxially-grown silicon compounds. In the pFET transistor, the typical Vth shift is about 10 mV per percentage of germanium used. For example, for a 250 mV Vth shift, the percentage of germanium in the SiGe material is about 25 percent. The SiO2 oxide hard mask is removed from the NMOS regions of both logic and SRAM, resulting in the structure shown in FIG. 9 in which the PMOS regions of the logic and SRAM structures are both covered with SiGe epitaxial layer 120. The oxide may be recessed with hydrofluoric acid (HF), SiCoNi, or COR chemistry.

Figure 10:
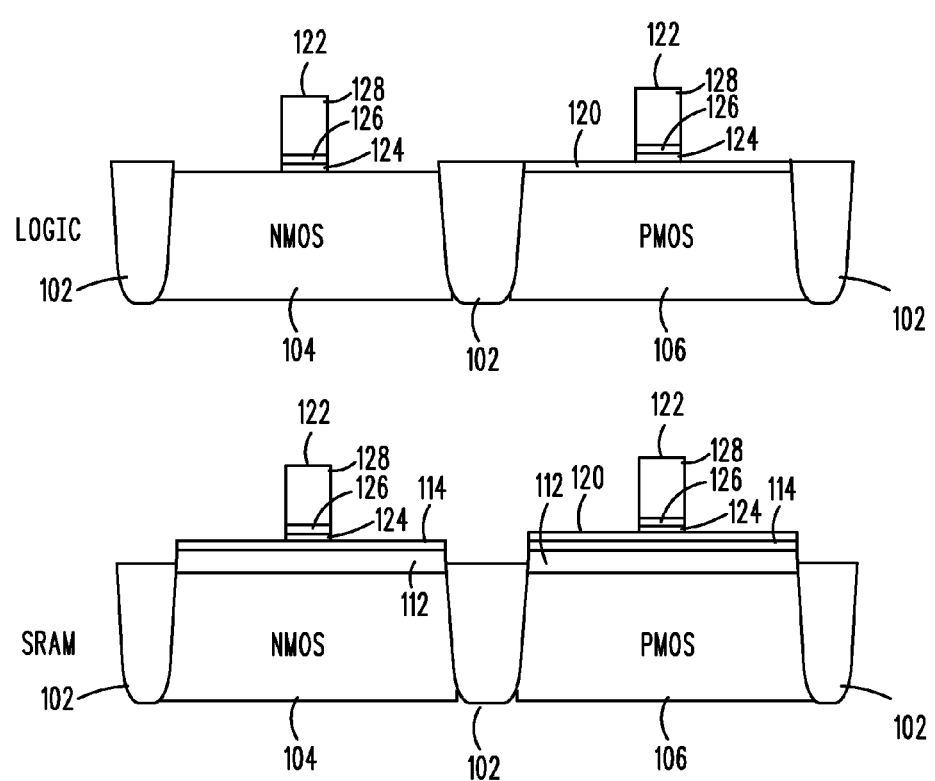
FIGS. 10 to 13 illustrates gate stack formation, in accordance with embodiments of the present disclosure.

Next, starting at FIG. 10, gate stacks 122 are formed on the NMOS and PMOS regions. Layers of hydrofluoric silicon oxide nitride (HfSiON) 124, titanium nitride (TiN) 126, and polysilicon 128 are sequentially deposited on the NMOS and PMOS regions 104, 106. The gate material is patterned and a gate etch stops on the SiGe layer 120 over the PMOS regions 106, on the Si layer 114 of the NMOS 104 SRAM region, and on the substrate of NMOS region 104 of the logic structure.

The gate stacks 122 are formed. Composition of a bulk gate material used to form the gate stacks 122 may include a work function metal alloy, for example, tantalum nitride (TaN), titanium nitride (TiN), or titanium aluminum (TiAl). The bulk gate material may be polysilicon. A conventional metal deposition process can be used to deposit the gate 122, such as CVD, PVD, an electroplating process, or an electroless plating process. Alternatively, a conventional polysilicon gate 122 can be deposited.

Figure 11:
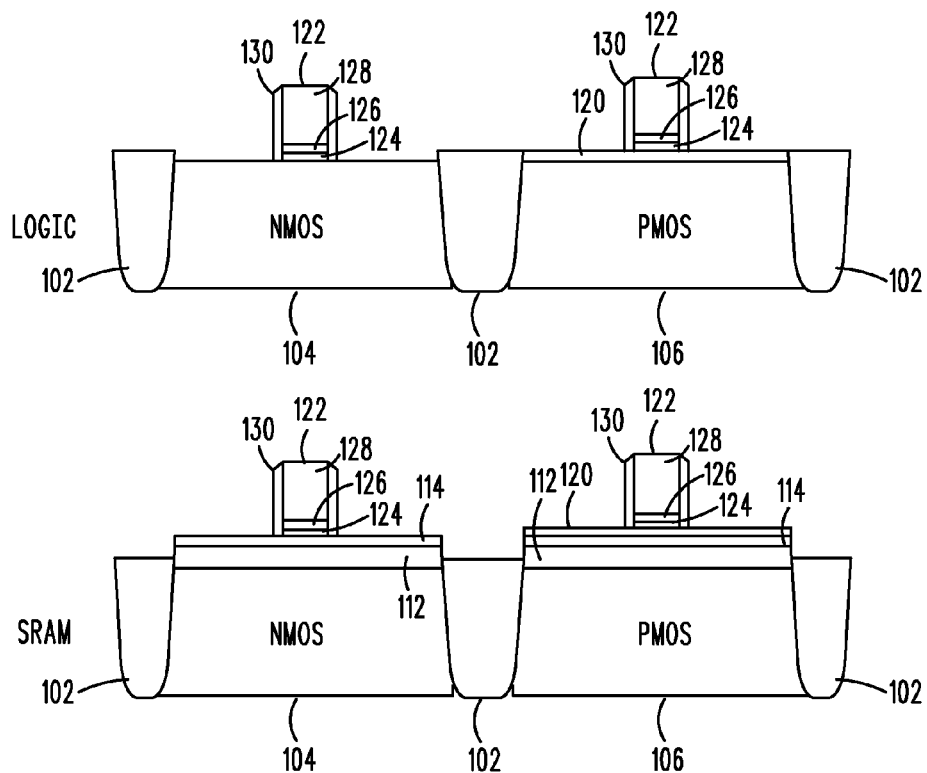

Continuing with creation of the gate regions, spacers of dielectric material are formed by deposition of a silicon nitride (SiN) layer 130 on the sidewalls of the gate stacks 122 in FIG. 11. The silicon nitride layer 130 may be patterned and etched, for example, using a directed (anisotropic) plasma etch, also referred to as a reactive ion etch (RIE) process. Following the RIE etch, a standard wet chemical cleaning process can be used to remove residual photoresist. The thickness of the SiN layer thus formed on the sidewalls may range from approximately 3 nm to approximately 15 nm.

Composition of the gate spacer 130 can alternately be silicon dioxide, having a dielectric constant of about 4.0. The gate spacer can be deposited using, for example, a thermal growth process or a CVD process.

Figure 12:
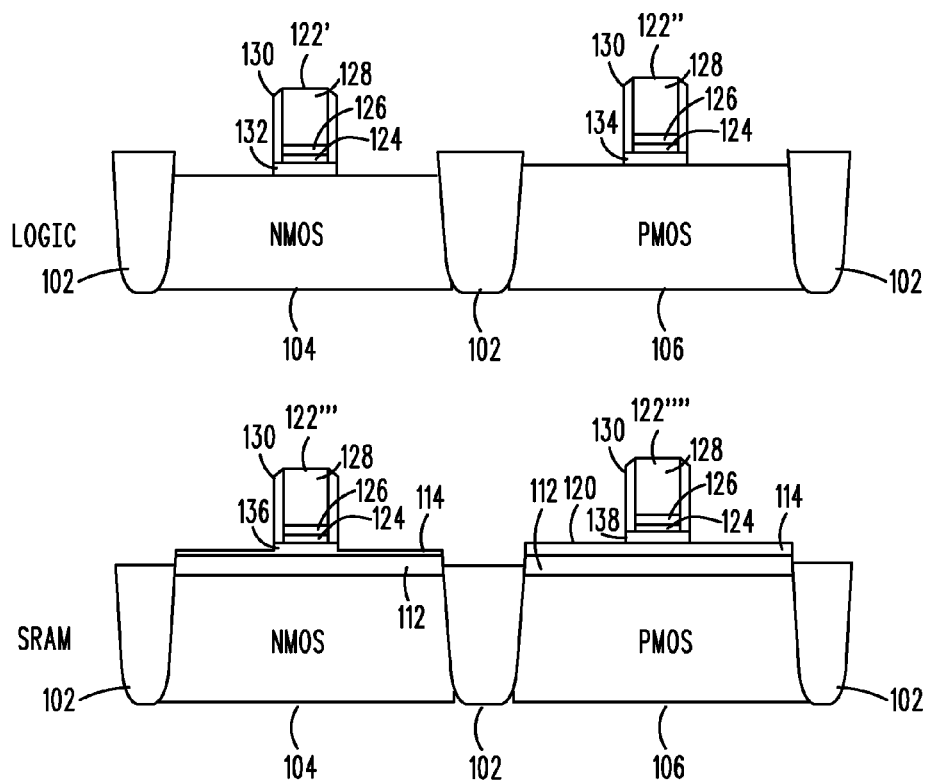

Etching of the exposed silicon epitaxial layer in each of the NMOS and PMOS regions for both logic and SRAM results in the formation of an epitaxial silicon region under the gate stacks in FIG. 12. The use of a RIE process etches into a portion of the exposed silicon epitaxial layer, Si or SiGe as the case may be, resulting in the formation of an epitaxial silicon region under the gates. For the logic NMOS structure, this process results in a Si region 132 under the gate stack 122'. For the logic PMOS structure, this process results in a SiGe region 134 under the gate stack 122". For the SRAM NMOS structure, this process results in a Si region 136 under the gate stack 122'". For the SRAM PMOS structure, this results in a SiGe region 138 under gate stack 122"".

As the etching process necessarily cuts into the epitaxial silicon layer to form the epitaxial silicon region under the gate stacks, it can be seen that the layer which is etched is thinner or non-existent than before the etch. For example, for the logic NMOS structure, the NMOS substrate 104 is reduced with respect to the trenches 102. For the logic PMOS structure, the SiGe layer 120 has been removed except for under the gate stack. For the SRAM NMOS structure, the Si layer 114 is thinner though still there, to yield SiGe region 136 under gate stack 122'". For the SRAM PMOS structure, the SiGe layer has been removed, leaving only SiGe region 138 under gate stack 122"".

Figure 13:
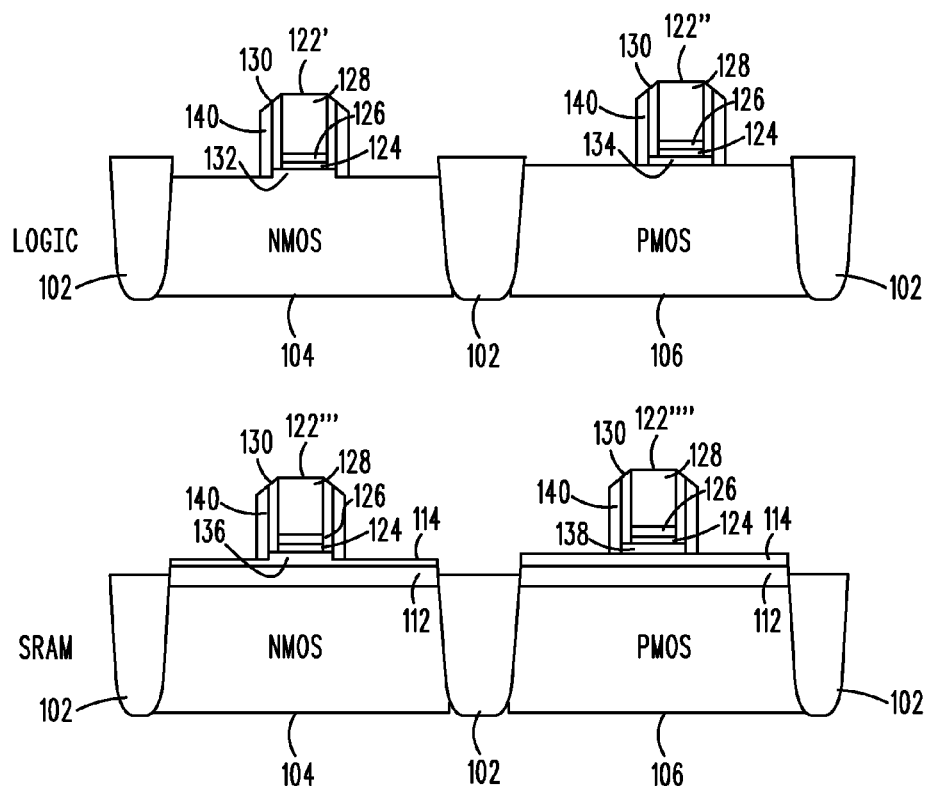

In FIG. 13, the formation of sacrificial SiO2 spacers 140 are used to encapsulate the epitaxial silicon region formed under the gate stack in FIG. 12. As will be seen the epitaxial silicon regions will be part of the channel and thus also referred to as channel epitaxial silicon regions or channel epitaxial regions. Thus, in the logic NMOS structure, SiO2 spacers 140 encapsulate Si region 132. In the logic PMOS structure, SiO2 spacers 140 encapsulate SiGe region 134. In the SRAM NMOS structure, SiO2 spacers 140 encapsulate Si region 136. In the SRAM PMOS structure, SiO2 spacers 140 encapsulate SiGe region 138, as shown.

Figure 17:
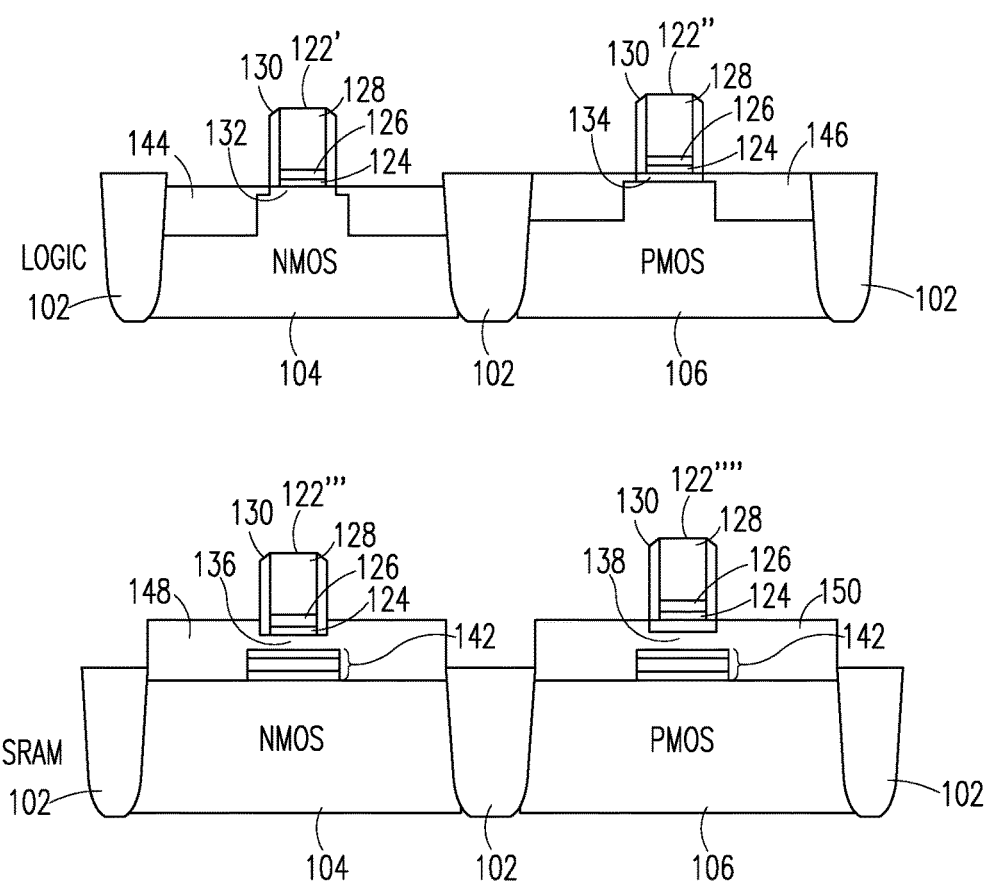
FIG. 17 illustrates oxide spacer removal and formation of raised source and drain by epitaxy, in accordance with embodiments of the present disclosure.

As will be shown below in connection with the description of FIG. 17, formation of sacrificial spacers 140 will be removed to allowed raised source/drain regions to be formed. Because these spacers will later be removed, they are referred to as sacrificial.

Figure 14:
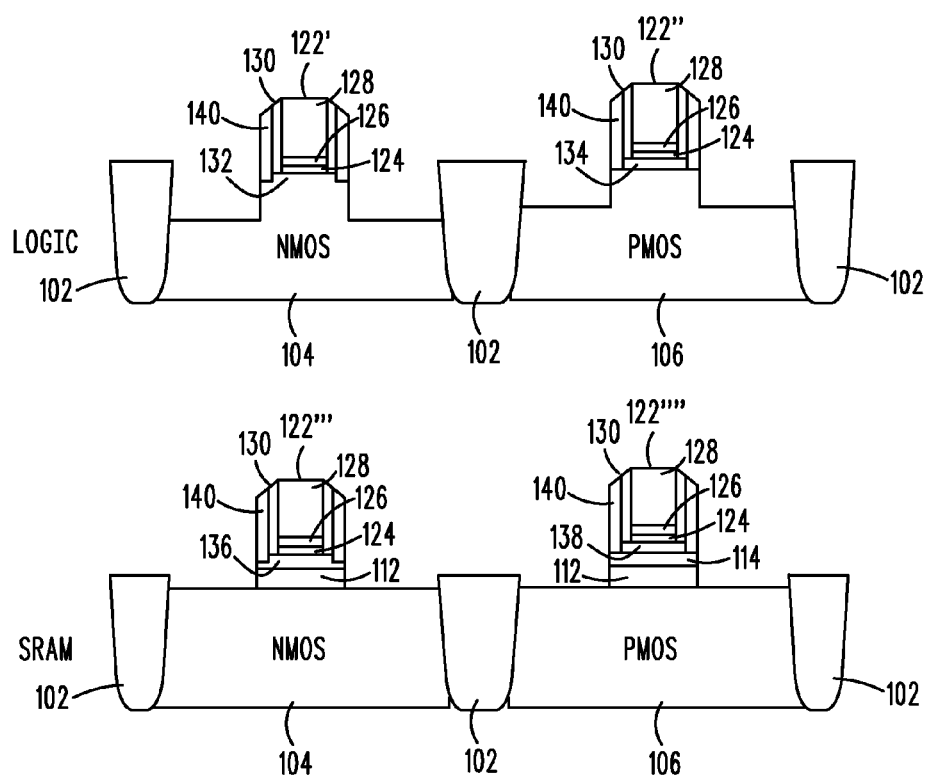
FIG. 14 illustrates junction etching, in accordance with embodiments of the present disclosure.
Figure 15:
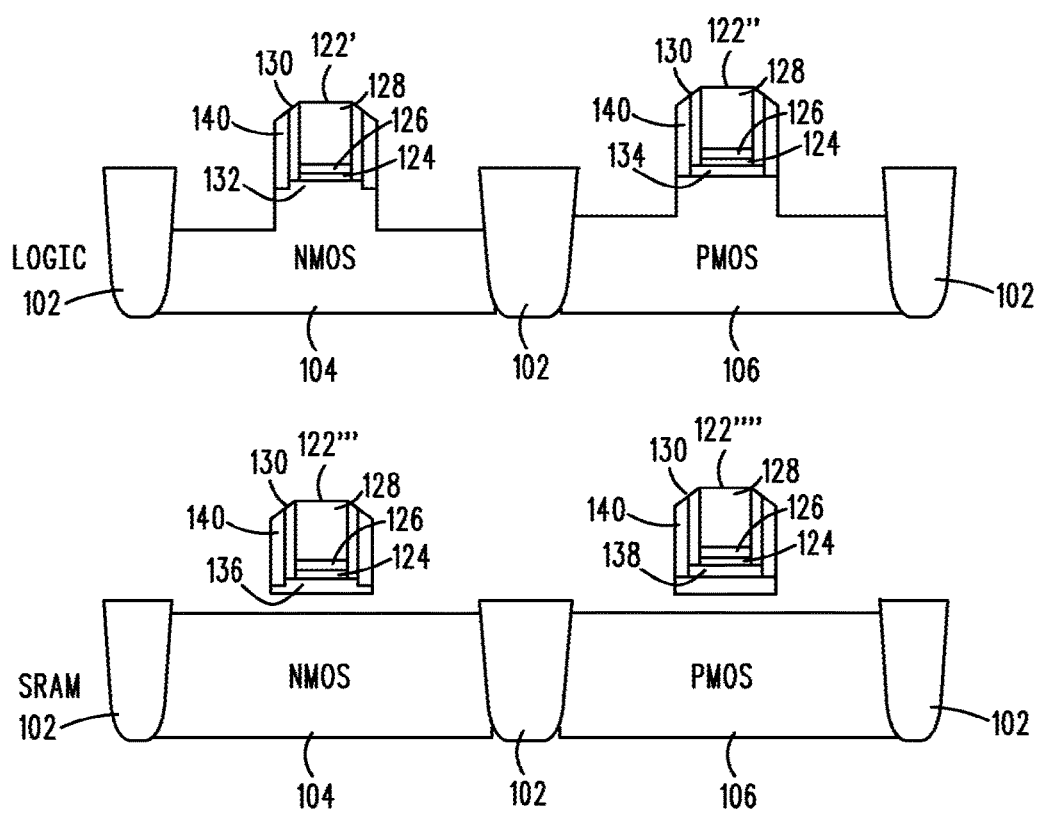
FIG. 15 illustrates removal of sacrificial silicon germanium under the transistor channel consistent with silicon-on-nothing fabrication, in accordance with embodiments of the present disclosure.

In FIG. 14, the transistor channel/substrate junctions are formed by etching away on either side of the epitaxial silicon region portions of silicon substrate (in the case of the logic devices) or portions of layers of silicon epitaxial layers, such as 112, 114 previously deposited on the silicon substrate (in the case of the SRAM devices), leaving intact the silicon substrate or layers of silicon epitaxial layers under the epitaxial silicon region. RIE may be used to recess the substrate junctions, thereby forming the transistor channels. In the logic devices, the RIE recesses silicon, while for the SRAM devices the RIE process stops on the silicon substrate. Next, as shown in FIG. 15, sacrificial SiGe removal under the channel for the SRAM devices occurs. SiGe may be selectively removed with a vapor-phase hydrochloric acid (HCl) etch in a range of temperatures, such as between approximately 500 degrees Celsius and approximately 700 degrees Celsius, at a pressure that ranges between approximately 5 Torr and approximately 500 Torr. This is a selective process. The pressure can be approximately 60 Torr to selectively remove SiGe having a germanium content of about 30 percent, or the pressure can be approximately greater than 400 Torr to selectively remove SiGe having a germanium content of about 50 percent. This process provides for floating gates in the SRAM devices only. Thus, gate stack 122''' with Si region 136 floats above NMOS region 104 and gate stack 122'''' with SiGe region 138 floats above PMOS region 106. As is known, the Torr unit of pressure, commonly used in vacuum engineering, equals approximately 133.3 pascals.

Figure 16:
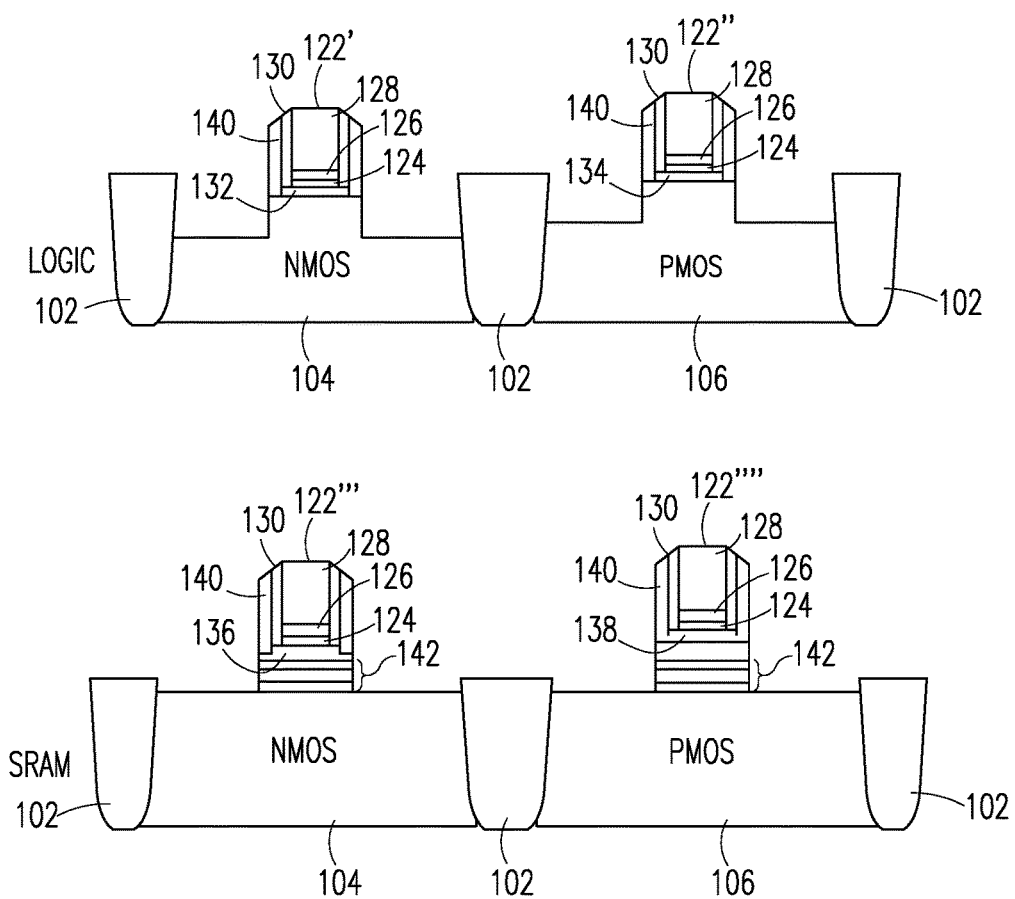
FIG. 16 illustrates formation of an insulating material below the channel, in accordance with embodiments of the present disclosure.

In FIG. 16, a layer 142 of $SiO_2$ and SiN is deposited on the SRAM structures, followed by a directional etch in a way in which the layer remains only underneath the channel, as shown. The buried oxide (BOX) formation fills the empty space below the epitaxial silicon region under the channel with insulating material, in this example the $SiO_2$ and SiN layer 142. Filling the space under the epitaxial silicon regions 136 and 138 of the channels of the SRAM devices may be accomplished by depositing a first layer of $SiO_2$ 162 on the silicon substrate; depositing a layer of SiN 164 over the first layer of $SiO_2$; depositing a second layer of $SiO_2$ 166 on the layer of SiN; and removing by a directional etch the first and second layers of $SiO_2$ and the layer of SiN on either side of the channel but not under the epitaxial silicon region as shown. In FIG. 17, the sacrificial spacers 140 are removed and raised epitaxial source/drain regions formed by silicon (Si) epitaxial growth. The oxide spacers 140 may be selectively removed with a HF etch.

Prior to growth of epitaxial source/drain regions from the silicon substrate, a pre-clean can be performed to remove residual oxide, including native oxide, from the silicon surface to prepare the silicon surface for epitaxial growth. The source and drain can be grown epitaxially from the silicon surface, directly after the pre-clean. The presence of a pristine crystalline structure, such as 100 crystalline structure, at the silicon surface tends to facilitate epitaxial growth. There are many possible choices for the composition of the epitaxial raised source and drain, for example, epitaxial silicon, an in-situ-doped epitaxial SiGe layer, or an implanted epitaxial SiC layer, among others.

The raised source/drain regions are grown to be approximately coplanar with the epitaxial silicon region in the channel under the gate stack, also referred to as the channel epitaxial silicon region under the gate stacks, such as 132, 134, 136, 138, as shown. In the SRAM devices, the source/drain epitaxy ensures connection of the substrate to the channel. For the logic devices, it can be seen that removal of the sacrificial spacers allows at least a portion of the raised source/drain regions formed to be contiguous the epitaxial silicon region on either side as well as approximately coplanar with the epitaxial silicon region, with the contiguous portion having a depth that approximates that of the depth of the epitaxial silicon region. Thus, for the NMOS logic device, source/drain regions 144 is approximately co-planar with region 132. For the PMOS logic device, source/drain regions 146 are approximately co-planar with region 134. For the NMOS SRAM device, source/drain regions 148 are approximately co-planar with region 136. For the PMOS SRAM device, source/drain regions 150 are approximately co-planar with region 138. Again, the formation of the source/drain regions by silicon epitaxy in the SRAM devices ensures that the device substrate is connected to the channel. The raised source/drain epitaxy may be silicon Si, silicon germanium SiGe, or silicon carbide phosphorous (SiCP), as examples.

Figure 18:
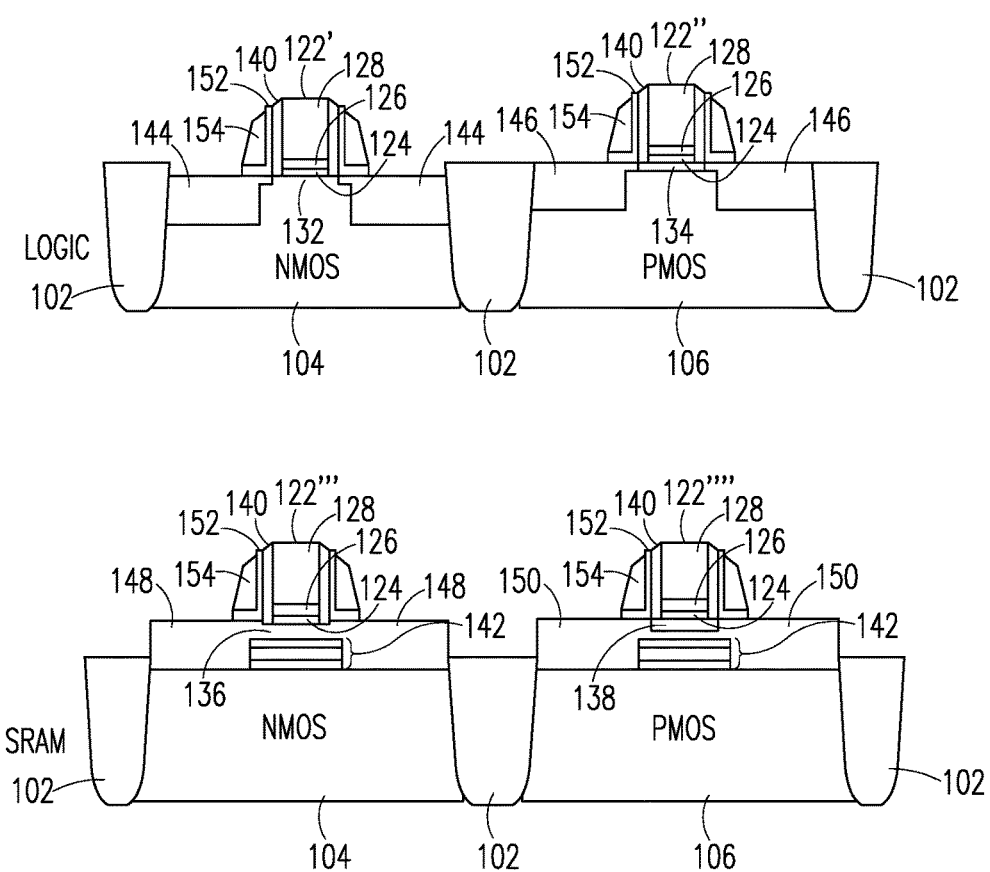
FIG. 18 illustrates final spacer formation, in accordance with embodiments of the present disclosure.

In FIG. 18, a final spacer formation is undertaken. A layer of $SiO2$ 152 and SiN 154 over SiN spacer 140 followed by selective RIE may be used to form the spacers shown. The spacers are formed on either side of the gate stack and above a portion of the raised epitaxial source and drain contiguous the epitaxial silicon region. The layer spacers may be formed by depositing a first layer of $SiO_2$ on the raised epitaxial source and drain; depositing a layer of SiN over the first layer of $SiO_2$; depositing a second layer of $SiO_2$ on the layer of SiN; and removing by a directional etch the first and second layers of $SiO_2$ and the layer of SiN on either side of the gate stack and above a portion of the raised epitaxial source and drain contiguous the epitaxial silicon region. There are many possible choices for the composition of the epitaxial source/drain regions formed in FIG. 18. For example, epitaxial silicon, an in-situ-doped epitaxial SiGe layer, or an implanted epitaxial SiC layer to form the junction, among others may be employed to form the final transistor structures shown in FIG. 19.

Figure 19:
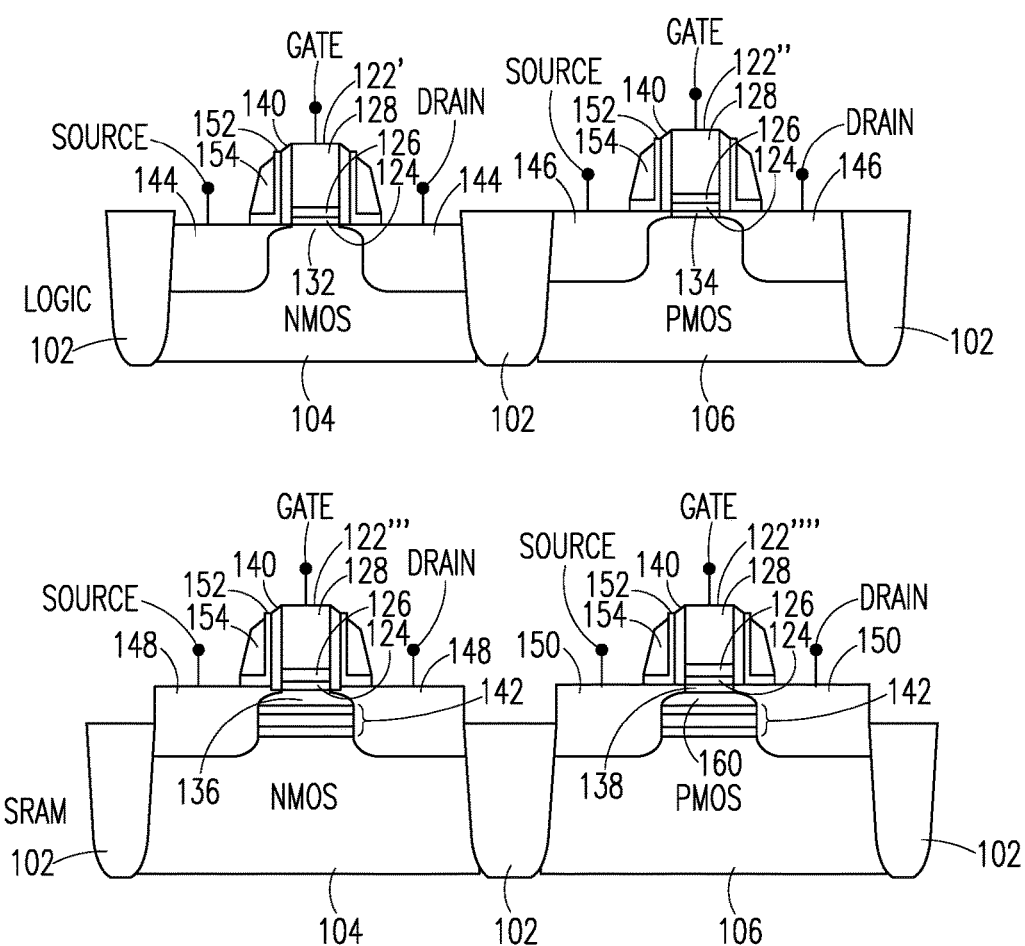
FIG. 19 illustrates final transistor types, in accordance with embodiments of the present disclosure.

As is shown in FIG. 19, the final transistor structure varies of reach of the transistor types shown, but they all have an epitaxial silicon region interposed between the gate stack and the substrate, either directly or indirectly. It can be seen that where the transistor is a logic device, the epitaxial silicon region is in contact with the upper surface of the silicon substrate. As is understood from the discussion of formation of the logic devices, the epitaxial silicon region of the NMOS logic device is Si while the epitaxial silicon region of the PMOS logic device is SiGe. Where the transistor is a SRAM device, the epitaxial silicon region is not in direct contact with the silicon substrate but is coupled to the insulating material (such as the $SiO_2$ and SiN layer) formed on an upper surface of the silicon substrate. The insulating material is in contact with the raised epitaxial source and drain and has an upper surface to which the epitaxial silicon region is coupled. Where the transistor is a NMOS SRAM device, the epitaxial silicon region is in direct contact with the upper surface of the insulating material. As previously described, the epitaxial silicon region of the NMOS SRAM device is silicon (Si). Where the transistor is a PMOS SRAM, an epitaxial silicon layer 160 is interposed between the epitaxial silicon region and the insulating material, with the epitaxial silicon layer in contact with the raised epitaxial source and drain and having a thickness at a bottom surface that approximates the thickness of the insulating material and a thickness at a top surface that approximates the thickness of the epitaxial silicon region, as shown. As previously described, the epitaxial silicon region of the PMOS SRAM device is silicon germanium (SiGe).

With regard to the relationship between the raised epitaxial source and drain and the epitaxial silicon region, the following can be observed from the drawings. In the NMOS logic device, PMOS logic device and PMOS SRAM device, it can be seen that the raised epitaxial source and drain are substantially coplanar with their respective epitaxial silicon region. It can also be seen in the case of the NMOS SRAM device, that while the raised epitaxial source and drain are not substantially coplanar with the epitaxial silicon region 136, the portions of the raised epitaxial source and drain in contact with epitaxial silicon region 136 are substantially planar with the epitaxial silicon region. Moreover, it can be seen in all cases, a NMOS logic device, a PMOS logic device, a NMOS SRAM device, and a PMOS SRAM device, that the portions of the raised epitaxial source and drain in contact with the respective epitaxial silicon region have a thickness that approximates that of the epitaxial silicon region with which they are in contact.

With regard to the relationship between the gate stacks and the epitaxial silicon regions on which they are formed, it can be seen that for the NMOS logic device, PMOS logic device, and PMOS SRAM device the width of the gate stack structure approximates the width of the epitaxial silicon region on which they rest. In the case of the NMOS SRAM device, however, implantation to form the junction results in the epitaxial silicon region 136 being somewhat narrower in width than the gate stack width.

The creation of the epitaxial silicon region (Si or SiGe, for example) under the gate stacks in the channel regions, i.e. the channel epitaxial silicon regions, provides the advantages of higher mobility and Vth adjustment of the resulting transistors. PMOS devices need channel SiGe epitaxial regions to provide Vth tuning but the silicon-on-nothing process needs to undercut the channel SiGe in the BOX formation, described in FIG. 16. The challenge of protecting the channel epitaxial silicon regions SiGe in PMOS devices during silicon-on-nothing fabrication is met.

Referring now to FIG. 20, a flow chart 2000 of a method of forming a transistor on a silicon substrate is shown. At Block 2010, a gate stack structure is formed on an epitaxial silicon region disposed on a silicon substrate, a width dimension of the epitaxial silicon region approximating a width dimension of the gate stack structure as illustrated and discussed in connection with FIGS. 1-12. Next, at Block 2020, the epitaxial silicon region under the gate stack structure is encapsulated with sacrificial spacers formed on both sides of the gate stack structure and the epitaxial silicon region, as illustrated and discussed in connection with FIG. 13. A channel of the transistor having a width dimension that approximates that of the epitaxial silicon region and the gate stack structure is formed at Block 2030, the epitaxial silicon region and the gate stack structure formed on the channel of the transistor, as illustrated and discussed in connection with FIGS. 14-16. At Block 2040, a raised epitaxial source and drain is grown from the silicon substrate with portions that are in contact with the epitaxial silicon region under the gate stack structure, as illustrated and discussed in connection with FIGS. 17-19.

The implementations of the present disclosure described above are intended to be merely exemplary. It will be appreciated by those of skill in the art that alterations, modifications and variations to the illustrative embodiments disclosed herein may be made without departing from the scope of the present disclosure. Moreover, selected features from one or more of the above-described exemplary embodiments may be combined to create alternative embodiments not explicitly shown and described herein.

The present disclosure may be embodied in other specific forms without departing from its spirit or essential characteristics. The described exemplary embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope.

What is claimed is:

1. A transistor comprising:
    a silicon substrate having an upper surface;
    a trench structure in the substrate;
    a raised epitaxial source and drain extending above and in contact with the upper surface of the silicon substrate;
    an epitaxial silicon region positioned between and in contact with the raised epitaxial source and drain; and
    a gate stack structure in contact with the epitaxial silicon region and coupled to the raised epitaxial source and drain by the epitaxial silicon region.

2. The transistor of claim 1, wherein the transistor is a logic device and the epitaxial silicon region is in contact with the upper surface of the silicon substrate.

3. The transistor of claim 2, wherein the transistor is a NMOS logic device and the epitaxial silicon region comprises silicon.

4. The transistor of claim 2, wherein the transistor is a PMOS logic device and the epitaxial silicon region comprises silicon germanium.

5. The transistor of claim 1, wherein the transistor is an SRAM device.

6. The transistor of claim 5, wherein the transistor is an NMOS SRAM device further comprising a layer of insulating material formed on the silicon substrate and positioned between and in contact with the raised epitaxial source and drain, the epitaxial silicon region being positioned on and in contact with the layer of insulating material.

7. The transistor of claim 6, wherein the epitaxial silicon region of the NMOS SRAM device comprises silicon (Si).

8. The transistor of claim 5, wherein the transistor is a PMOS SRAM device.

9. The transistor of claim 8, wherein the epitaxial silicon region of the PMOS SRAM device comprises silicon germanium (SiGe).

10. The transistor of claim 5, wherein the transistor is a PMOS device and the epitaxial silicon region comprises silicon germanium (SiGe).

11. The transistor of claim 5, wherein the transistor is an NMOS device and the epitaxial silicon region comprises silicon (Si).

12. The transistor of claim 1, wherein an upper surface of the raised epitaxial source and drain is substantially coplanar with an upper surface of the epitaxial silicon region.

13. The transistor of claim 12, wherein the transistor is an NMOS logic device, a PMOS logic device or a PMOS SRAM device.

14. The transistor of claim 1, wherein portions of the raised epitaxial source and drain in contact with the epitaxial silicon region have a thickness that approximates a thickness of the epitaxial silicon region.

15. The transistor of claim 14, wherein the transistor is an NMOS logic device, a PMOS logic device, an NMOS SRAM device or a PMOS SRAM device.

16. The transistor of claim 1, wherein the gate stack structure and the epitaxial silicon region have a substantially same width.

17. The transistor of claim 16, wherein the transistor is an NMOS logic device, a PMOS logic device, or a PMOS SRAM device.

18. The transistor of claim 1, wherein the transistor is a PMOS device and the epitaxial silicon region is positioned under the gate stack and configured to tune a voltage threshold (Vth) of the PMOS device.

19. The transistor of claim 18, wherein the PMOS device is either a PMOS logic device or a PMOS SRAM device.

20. A device comprising:
    a first transistor including:
        a first portion of a silicon substrate, the first portion having a first conductivity type;
        a first raised epitaxial source and drain extending above and in contact with an upper surface of the first portion of the silicon substrate;

a first epitaxial silicon region positioned between and in contact with the first raised epitaxial source and drain; and a first gate stack structure in contact with the first epitaxial silicon region and coupled to the first raised epitaxial source and drain by the first epitaxial silicon region;

a second transistor including:

a second portion of the silicon substrate, the second portion having a second conductivity type;

a second raised epitaxial source and drain extending above and in contact with an upper surface of the second portion of the silicon substrate;

a second epitaxial silicon region positioned between and in contact with the second raised epitaxial source and drain; and a second gate stack structure in contact with the second epitaxial silicon region and coupled to the second raised epitaxial source and drain by the second epitaxial silicon region; and a trench extending between and contacting the first and second transistors.

21. The device of claim 20, wherein the device comprises a logic device.

22. The device of claim 20, wherein the device comprises a static random access memory (SRAM) device.

\* \* \* \* \*